(12) United States Patent
Cui

(10) Patent No.: US 9,813,051 B2
(45) Date of Patent: Nov. 7, 2017

(54) DRIVING CIRCUIT FOR POWER SWITCH

(71) Applicant: STMicroelectronics (Beijing) R&D Co. Ltd, Beijing (CN)

(72) Inventor: Zhenghao Cui, Beijing (CN)

(73) Assignee: STMicroelectronics (Beijing) R&D Co. Ltd, Beijing (CN)

( * ) Notice: Subject to any disclaimer, the term of this patent is extended or adjusted under 35 U.S.C. 154(b) by 0 days.

(21) Appl. No.: 15/052,170

(22) Filed: Feb. 24, 2016

(65) Prior Publication Data
US 2017/0237421 A1    Aug. 17, 2017

(30) Foreign Application Priority Data

Feb. 16, 2016 (CN) .......................... 2016 1 0088186

(51) Int. Cl.
| | | |
|---|---|---|
| *H03K 17/04* | (2006.01) | |
| *H03K 17/041* | (2006.01) | |
| *H03K 17/16* | (2006.01) | |

(52) U.S. Cl.
CPC ..... *H03K 17/04106* (2013.01); *H03K 17/165* (2013.01)

(58) Field of Classification Search
CPC .. H03K 17/04; H03K 17/04123; H03K 19/01; H03K 17/04106; H03K 17/04113; H03K 17/0412; H03K 17/04126
USPC ....................................... 327/374, 376, 377
See application file for complete search history.

(56) References Cited

U.S. PATENT DOCUMENTS

| | | | | |
|---|---|---|---|---|
| 7,362,147 | B2* | 4/2008 | Rebholz-Goldmann | ........... H03K 17/164 327/108 |
| 8,446,207 | B2* | 5/2013 | Sasaki | .............. H03K 17/04206 327/377 |
| 2016/0072376 | A1* | 3/2016 | Ahlers | ................ H01L 27/0207 310/68 D |

OTHER PUBLICATIONS

Vishay Siliconix: "Power MOSFET Basics: Understanding Gate Charge and Using it to Assess Switching Performance," Applicaiton Note 608, Doucment No. 73217, Revision Dec. 2, 2004, www.vishay.com, pp. 1-6.

* cited by examiner

*Primary Examiner* — Lincoln Donovan
*Assistant Examiner* — Diana J Cheng
(74) *Attorney, Agent, or Firm* — Gardere Wynne Sewell LLP

(57) ABSTRACT

An electronic circuit is for switching a power transistor having a drain coupled to a drain node, a source coupled to a lower voltage supply, and a gate coupled to a gate node. The electronic circuit includes first current generation circuitry to generate a first current to flow into the gate node in response to assertion off an ON signal, the first current being substantially constant. Second current generation circuitry generates a second current to flow into the gate node in response to deassertion of an OFF signal, the second current being inversely proportional to a gate to source voltage of the power transistor. First comparison circuitry compares a drain voltage at the drain node to a reference voltage, and activates third current generation circuitry to generate a third current to flow into the gate node when the drain voltage is less than the reference voltage.

22 Claims, 3 Drawing Sheets

DRIVING CIRCUIT FOR POWER SWITCH

PRIORITY CLAIM

This application claims priority from Chinese Application for Patent No. 201610088186.X filed Feb. 16, 2016, the disclosure of which is incorporated by reference.

TECHNICAL FIELD

This disclosure relates to the field of power switches, and, more particularly, to a driver circuit for precisely controlling the slew rate of the gate node of the power switching.

BACKGROUND

Power switches, such as field effect transistors, are widely used in a variety of circuits and a variety of devices. An ideal power switch would be capable of switching on immediately when instructed to do so by a control signal. However, real world devices are not ideal, and thus there is a delay between receipt of the control signal by the power switch and the actual turning on of the switch. The converse is true with respect to the turning off of the power switch.

The delay in the switching operation of the power switch imposes a constraint on the switching frequency and duty cycle of power switch. During the switching of the power switch, the voltage slew rate of the switching node should be controlled to improve EMI (Electro Magnetic Interference) behavior so as to not disturb operation of other portions of an electronic device incorporating the power switch. For a low side driving power switch, the switching node is drain of the power switch. For a high side driving power switch, the switching node is the source of the power switch. If the slew rate of the switch node is fast, an undesirable amount of EMI is generated. However, if the slew rate of the switch node is slow, the efficiency of the power switch is low since power consumption during switching is high.

Therefore, a need exists for a driving circuit for a power switch that can carefully and precisely control the slew rate of the switch node.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

One embodiment is directed to an electronic circuit for switching a power transistor having a drain coupled to a drain node, a source coupled to a lower voltage supply, and a gate coupled to a gate node. The electronic circuit includes first current generation circuitry configured to generate a first current to flow into the gate node in response to assertion of an ON signal, the first current being substantially constant. Second current generation circuitry is configured to generate a second current to flow into the gate node in response to deassertion of an OFF signal, the second current being inversely proportional to a gate to source voltage of the power transistor. First comparison circuitry is configured to compare a drain voltage at the drain node to a reference voltage, and to activate third current generation circuitry to generate a third current to flow into the gate node when the drain voltage is less than the reference voltage.

A further embodiment is directed to an electronic device having a power transistor having a drain coupled to a drain node, a source coupled to a lower voltage supply, and a gate coupled to a gate node. The electronic device includes first turn off circuitry coupled to the gate node and configured to draw a first current from the gate node in response to assertion of the OFF signal, the first current being proportional to a gate to source voltage of the power transistor. Second turn off circuitry is coupled to the gate node and configured to draw a second current from the gate node in response to assertion of the OFF signal, the second current being substantially constant. Second comparison circuitry is configured to compare a gate voltage at the gate node to a reference voltage, and to draw a third current from the gate node when the gate voltage is less than the reference voltage.

An additional embodiment is directed to an electronic device for switching a power transistor having a drain coupled to a drain node, a source coupled to a lower voltage supply, and a gate coupled to a gate node. The electronic device includes first current sourcing circuitry configured to generate a first current to flow into the gate node in response to assertion off an ON signal, the first current being substantially constant. Second current sourcing circuitry is configured to generate a second current to flow into the gate node in response to deassertion of an OFF signal, the second current being inversely proportional to a gate to source voltage of the power transistor. First comparison circuitry is configured to compare a drain voltage at the drain node to a reference voltage, and to activate third current generation circuitry to generate a third current to flow into the gate node when the drain voltage is less than the reference voltage. First current sinking circuitry coupled is to the gate node and configured to draw a fourth current from the gate node in response to assertion of the OFF signal, the fourth current being proportional to a gate to source voltage of the power transistor. Second current sinking circuitry is coupled to the gate node and configured to draw a fifth current from the gate node in response to assertion of the OFF signal, the fifth current being substantially constant. Second comparison circuitry is configured to compare a gate voltage at the gate node to a reference voltage, and to draw a sixth current from the gate node when the gate voltage is less than the reference voltage.

A method aspect is directed to a method of switching a power transistor that includes turning on the power transistor. Where a gate to source voltage of the power transistor is less than a miller plateau voltage of the power transistor, a first current is generated to flow into a gate of the power transistor in response to assertion of an ON signal, the first current being substantially constant. Where the gate to source voltage is within a threshold of the miller plateau voltage, a second current is generated to flow into the gate in response to deassertion of an OFF signal, the second current being inversely proportional to the gate to source voltage. Where the gate to source voltage is higher than the miller plateau voltage, a third current is generated to flow into the gate of the power transistor, the third current being substantially constant.

A further method aspect is directed to a method of switching a power transistor. The method includes turning off the power transistor. Where a gate to source voltage of the power transistor is greater than a miller plateau voltage of the transistor, a first current is drawn from a gate of the power transistor in response to assertion of the OFF signal, the first current being proportional to the gate to source voltage. Where the gate to source voltage is within a threshold of the miller plateau voltage, a second current is drawn from the gate of the power transistor in response to assertion of the OFF signal, the second current being substantially constant. Where the gate to source voltage is less than the miller plateau voltage, a third current is drawn from the gate of the power transistor, the third current being substantially constant.

DETAILED DESCRIPTION

In the following description, numerous details are set forth to provide an understanding of the present disclosure. It will be understood by those skilled in the art, however, that the embodiments of the present disclosure may be practiced without these details and that numerous variations or modifications from the described embodiments may be possible.

Generally speaking, this disclosure provides for methods to minimize or reduce the delay associated with turn on and turn off of a power switch. To that end, the methods disclosed herein provide for accurate control of the slew rate of the drain or source of a power switch during switching so as to reduce the EMI (electromagnetic interference) generated from said switching. So as to optimize EMS (electromagnetic sensitivity), a strong turn on and strong turn off are implemented. The power switch can be a low side switch or a high side switch.

During a charging phase of the gate of power switch, the current charging the gate is adjusted according to the status of the power switch, which may be in an off status, at its Miller plateau, or in a fully turned on status. During a discharging phase, the gate of power switch likewise adjusted according to the status of the power switch. The power switch is turned on when a control signal instructing turn on arrives so as to minimize or reduce the turn on delay, and is turned off when a control signal instructing turn off arrives. During switching, the voltage slew rate on drain or source of the power switch is carefully controlled to minimize or reduce emission to other electrical circuits or devices. The strong turn on/off is implemented to help ensure full turn on/off the power switch to thereby improve robustness in case power is injected to the output of power switch.

Figure 1:
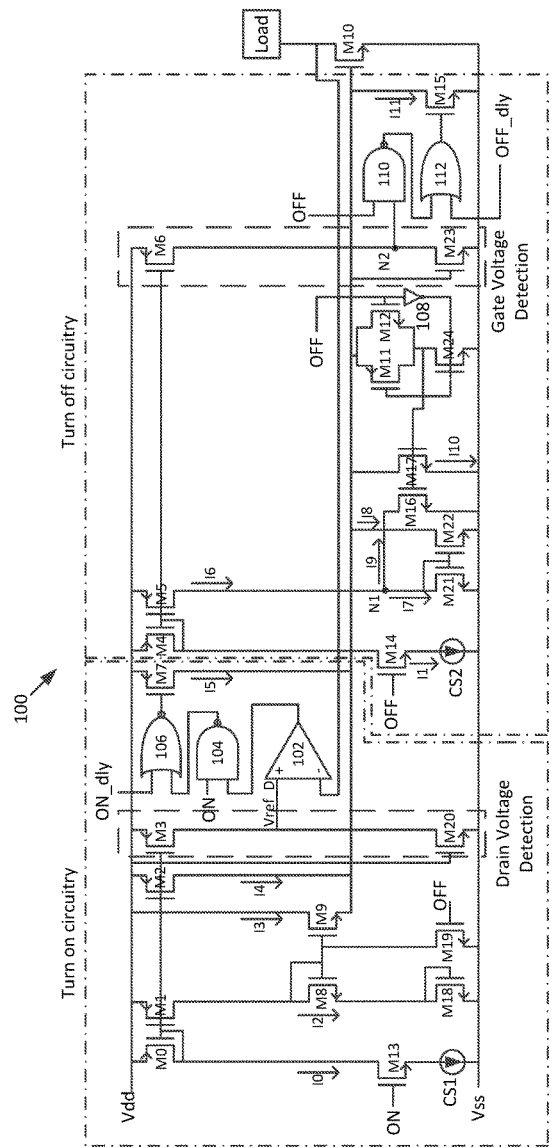
FIG. 1 is a schematic diagram of a driving circuit for a power switch, in accordance with this disclosure.

With reference to FIG. 1, a driving circuit 100 for driving a power switch M10 is now described. Transistor M0 has a source coupled to a positive power supply Vdd, and a gate coupled to its drain. Transistor M1 has its source coupled to Vdd and its gate coupled to the gate of transistor M0. The drain of transistor M0 is coupled to the drain of transistor M13, which has its source coupled to current source CS1 and its gate coupled to receive the "ON" signal. Current source CS1 is coupled between the drain of transistor M13 and the negative power supply Vss.

The drain of transistor M1 is coupled to the drain of transistor M8 and thus the gate of transistor M8. Transistor M18 has its drain coupled to the source of transistor M8, its gate coupled to its drain, and its source coupled Vss. Transistor M9 has its drain coupled to Vdd, its gate coupled to the gate of transistor M8, and its source coupled to the gate of the power switch M10. Transistor M19 has its drain coupled to the gates of transistors M8 and M9, its source coupled to Vss, and its gate coupled to receive the "OFF" signal.

Transistor M2 has its source coupled to Vdd, its drain coupled to the gate of the power switch M10, and its gate coupled to the gates of transistors M1 and M0. Transistor M3 has its source coupled to Vdd, its drain coupled to the drain of transistor M20, and its gate coupled to the gates of transistors M2, M1, and M0. Transistor M20 has its source coupled to Vss and its gate coupled to Vdd.

Comparator 102 has an inverting terminal coupled to the drain of the power switch M10, its non-inveting terminal coupled to the drains of transistors M3 and M20, and its output coupled to an input of NAND gate 104. NAND gate 104 has its other input coupled to receive the "ON" signal, and provides its output to an input of NOR gate 106. NOR gate 106 has its other input coupled to receive the "ON_dly" signal, which is a delayed and truncated version of the "ON" signal, and its output coupled to the gate of transistor M7. Transistor M7 has its source coupled to Vdd and its drain coupled to the gate of the power switch M10.

Transistor M4 has its source coupled to Vdd, its drain coupled to the drain of transistor M14, and its gate coupled to its drain. Transistor M14 has its source coupled to current source CS2, and its gate coupled to receive the "OFF" signal. Current source CS2 is coupled between the source of transistor M14 and Vss.

Transistor M5 has its source coupled to Vdd, its drain coupled to node N1, and its gate coupled to the gate and drain of transistor M4. Transistor M21 has its drain coupled to node N1, its source coupled to Vss, and its gate coupled to its drain. Transistor M22 has its drain coupled to the gate of the power switch M10, its source coupled to Vss, and its gate coupled to the gate and drain of transistor M21.

Transistor M16 has its drain coupled to node N1, its source coupled to Vss, and its gate coupled to the gate of transistor M17. Transistor M17 has its drain coupled to the gate of the power switch M10, its source soupled to Vss, and its gate coupled to the gate of transistor M16.

Transistor M11 has its source coupled to the drain of transistor M12 as well as to the gate of the power switch M10, its drain coupled to the source of transistor M12 as well as to the drain of transistor M24, and its gate coupled to the gate of transistor M24. Transistor M24 has its source coupled to Vss, and its gate also coupled to the gate of transistor M12 through an inverter 108. The gate of transistor M12 and input of the inverter 108 receive the "OFF" signal.

Transistor M6 has its source coupled to Vdd, its drain coupled to node N2, and its gate coupled to the gates of transistors M4 and M5. Transistor M23 has its gate coupled to the gate of transistor M10, its source coupled to Vss, and its drain coupled to node N2. NAND gate 110 has a first input coupled to receive the "OFF" signal and a second input coupled to node N2, and provides its output to an input of OR gate 112. OR gate 112 has a first input that receives the signal "OFF_dly", which is a delayed and truncated version of the "OFF" signal, and has its output coupled to the gate of transistor M15. Transistor M15 has its drain coupled to the gate of the power switch M10 and its source coupled to Vss.

Figure 3:
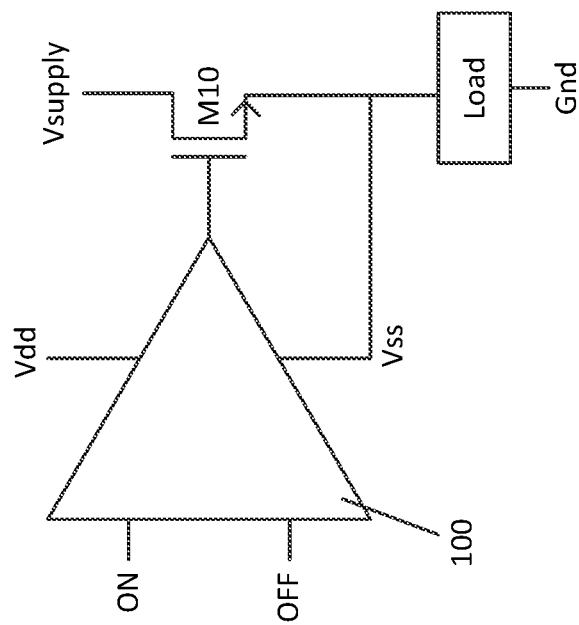
FIG. 3 shows a low side driving power switch utilizing the driving circuit of FIG. 1.

M10 is an on chip NMOS power switch. The positive supply Vdd and negative supply Vss are floating supply rails, where Vdd is maintained at certain voltage higher than Vss. Vss is connected to the source of M10. Where M10 is a low side switch, as shown in FIG. 1, Vss is at a ground voltage. Where M10 is a high side switch, Vss is a floating rail, as shown in FIG. 3. ON is the turn on signal of the power switch M10, while OFF is the turn off signal of the power switch M10. ON_dly is a delay signal of ON from logic '0' to logic '1'. The delay time is a function of how long time it will take for the switch M10 to be fully turned on. OFF_dly is a delay signal of OFF from logic '0' to logic '1'. The delay time is a function of how long time it will take for the switch M10 to be fully turned off.

Figure 4:
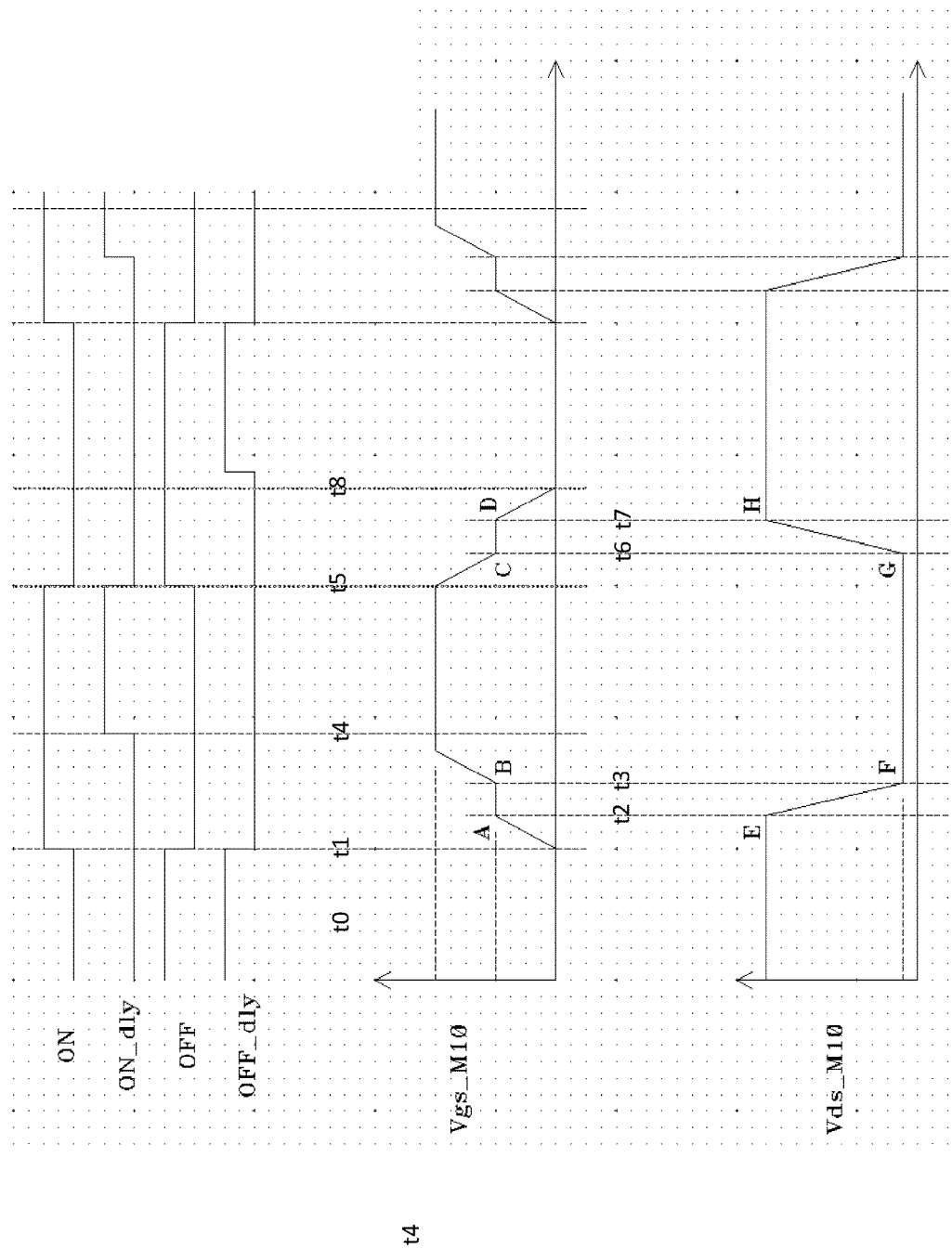
FIG. 4 is a timing diagram showing various signals of the driving circuit of FIG. 1 during operation.

FIG. 4 shows the plots of ON, ON_dly, OFF, OFF_dly, the gate-source voltage of transistor M10, and the drain-source voltage of M10. To simply the description, the voltages hereafter will be described relative to Vss.

Assume at time t0 that the power switch M10 is initially off, OFF is at a logic '1', and ON is at a logic '0'. OFF_dly is at a logic '1', and ON_dly is at a logic '0'. When OFF is at a logic '1', transistor M19 is on and drives the gate of transistor M9 to ground to turn off transistor M9. Transistor M15 is turned on by OR gate 112 in response to OFF_dly at a logic "1" to fully turn off the switch M10 as a strong turn off. This addresses the case where there is interference on the source or drain of switch M10. Such a strong turn off can help ensure the switch M10 is not turned on by interference on the source or drain of the switch M10 when it should otherwise be off. For example, there may be a power injection on the source or drain of the switch M10. This strong turn off can improve the EMS (Electro Magnetic Sensitivity) of the switch M10.

When ON changes from a logic '0' to a logic '1' at time t1, OFF and OFF_dly change to a logic '0' nearly at the same time. M13 is a transistor whose gate is controlled by ON. When transistor M13 is on, the current I0 flows through transistor M13 to transistor M0. Then a current mirror formed by transistors M1, M2 and M3 is activated. Because OFF is now at a logic '0', transistor M19 is switched off. The current I2 then biases the gate of transistor M9 to a voltage based on current I2, transistor M8, and transistor M18. Since the voltage of the gate of the power switch M10 is zero, the gate-source voltage of the transistor M9 is Vgs_M8+Vgs_M18.

The gate of the power switch M10 is then charged by currents I3 and I4. The current I4 is held nearly constant as the gate voltage of the switch M10 increases. The current I3 is a relatively large current when Vgs_M10 is small. As Vgs_M10 increases, the current I3 decreases. By choosing a proper value or size of the current I2, transistor M8, and transistor M18, Vgs_M10 can be charged to the threshold voltage of the switch M10 nearly immediately by the current I3. Then the current I3 decreases to a small value or zero since Vgs_M9 decreases as Vgs_M10 increases.

Thereafter, the switch M10 enters the Miller plateau and its gate is charged by the current I4. By properly selecting I4, the voltage slew rate of Vds_M10 at time t3 can thus be controlled. As shown in FIG. 4, Vgs_M10 changes from A to B in the Miller plateau during the turn on phase. Vds_M10 changes from E to F in the Miller plateau during the turn on phase. Transistor M20, transistor M3, and comparator 102 are a detection circuit for the drain voltage of the switch M10. The transistor M20 is same type of transistor as the switch M10, yet is smaller in size. The gate of M20 is connected to Vcc to make it permanently on. The current from transistor M3 biases the drain voltage of transistor M20 to a voltage used as a reference voltage for comparator 102 to check whether the drain voltage of the switch M10 is low enough such that the Miller plateau comes to an end during turn on phase at time t3. If the drain voltage of switch M10 is lower than Vref_D at the drain of the transistor M20, the drain voltage detection circuit indicates that the Miller plateau will end by changing the output of comparator 102. This "END" signal is logically combined with "ON" by logic circuits 104. The logic low from 106 will cause the transistor M7 turn on to pull the gate of M10 to Vdd.

The transistor M7 works as a strong turn on for the switch M10 to improve EMS. Since M20 is same type as M10, the reference voltage Vref_D changes with temperature. The temperature drift of the drain voltage of M10 at the end of Miller plateau is compensated. ON_dly can also turn on M7 after a delay time when ON signal is logic '1'. If there is something wrong with the drain voltage detection circuit, M7 can be turned on by ON_dly signal. The delay time between ON and ON_DLY going high is set to ensure there is enough time for the slew rate control works during Miller plateau zone. This is shown by time t4 in relation to time t3. Thus, the power switch M10 is fully turned on.

When the power switch M10 is to be turned off, the ON signal goes from a logic '1' to a logic '0', at time t5, as does ON_dly. OFF goes from a logic '0' to a logic '1'. Transistor M19 is then turned on to drive the gate of transistor M9 to Vss to switch off the transistor M9. Transistor M14 will also be turned on. The current I1 flows through transistor M14, and the current mirror formed by transistors M5 and M6 is activated. Transistors M11 and M12 are also turned on to short the drain and gate of transistor M17. Then, the transistor M17 is working as a diode connected NMOS.

The transistor M17 is the same type transistor as M10 although smaller. Thus, the transistor M17 helps discharge the gate of the switch M10 quickly. The transistor M16 mirrors the drain current of the transistor M17. By choosing proper sizes of the transistors M17, M16, M21 and M22, the discharge current of the gate of the gate M10 can be made to change as follows—when Vgs_M10 is high, the discharge current is large to thereby quickly discharge the gate voltage, and as Vgs_M10 decreases, the discharge current decreases. When the gate to source voltage of transistor M17, Vgs_M17, is lower than its threshold voltage, the current I10 goes to zero.

The discharge current of the gate of the switch M10 is thus set by the ratio of the current mirror of M21 and M22. The power switch M10 is then operating at the Miller plateau at time t6. The current I8 is a constant current. By controlling the current I8, the voltage slew rate of Vds_M10 is controlled. The transistors M23 and M6 are a gate voltage detection circuit of power switch M10. When the gate voltage of the switch M10 is lower than a threshold set by transistors M23 and M6, the drain voltage of transistor M23 will go from low to high. That results in the Miller plateau of the switch M10 during the turn off phase coming to an end at time t7. This signal "END" is logically combined with "OFF" by logic circuit 110. The logic high output from 112 causes the transistor M15 to turn on as a strong turn off of M10 to improve EMS. OFF_dly can also turn on M15 after a delay time of OFF signal if the gate voltage detection circuit experiences component failure. The delay time is set to help ensure that there is enough time for the Miller plateau. This is shown by time t8 in relation to time t7. Thus, the power switch M10 is fully turned off.

The advantages of this design are that turn on delay is reduced by the current I3 and the corresponding circuits. The voltage slew rate of Vds_M10 during the turn on phase is controlled by I4 and the corresponding circuits. The strong turn on is provided by the drain voltage detection circuit, transistor M7 and the corresponding circuits. The turn off delay is reduced by transistor M17 and the corresponding circuits. The voltage slew rate of Vds_M10 during the turn off phase is controlled by the current I8 and the corresponding circuits. The strong turn off is provided by the gate voltage detection circuit, transistor M15, and the corresponding circuits. Each working phase of the power switch M10 during turn on/off is properly controlled and optimized.

Figure 2:
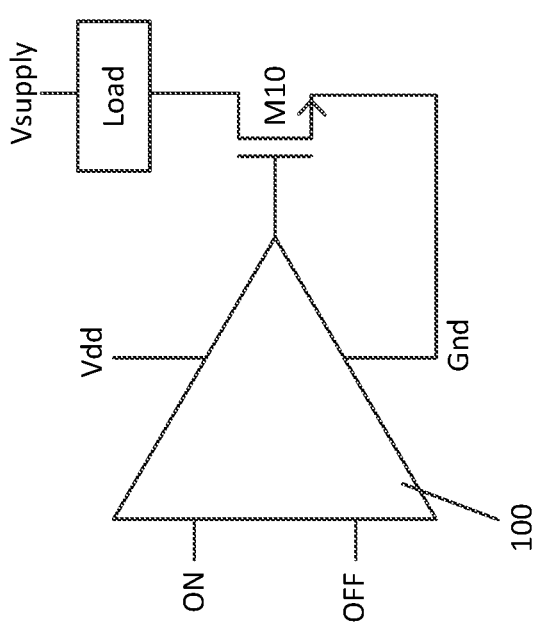
FIG. 2 shows a high side driving power switch utilizing the driving circuit of FIG. 1.

This design can be used as high side pre-driver or low side pre-driver for an N type power switch. FIG. 2 shows how this design works as pre-driver of a low side switch. FIG. 3 shows how the invention works as a pre-driver of a high side switch.

Although the preceding description has been described herein with reference to particular means, materials and embodiments, it is not intended to be limited to the particulars disclosed herein; rather, it extends to all functionally equivalent structures, methods, and uses, such as are within the scope of the appended claims.

The invention claimed is:

1. An electronic circuit for switching a power transistor having a drain coupled to a drain node, a source coupled to a lower voltage supply, and a gate coupled to a gate node, the electronic circuit comprising:
   first current generation circuitry configured to generate a first current to flow into the gate node in response to assertion of an ON signal, the first current being substantially constant;
   second current generation circuitry configured to generate a second current to flow into the gate node in response to deassertion of an OFF signal, the second current being inversely proportional to a gate to source voltage of the power transistor; and
   first comparison circuitry configured to compare a drain voltage at the drain node to a reference voltage, and to activate third current generation circuitry to generate a third current to flow into the gate node when the drain voltage is less than the reference voltage.

2. The electronic circuit of claim 1, wherein the first current generation circuitry comprises:
   a first transistor having a gate coupled to receive the ON signal, a drain, and a source;
   a first current source coupled between the source of the first transistor and the lower voltage supply; and
   a first current mirror having an input coupled to the drain of the first transistor and a first output coupled to the gate of the power transistor to output the first current thereto.

3. The electronic circuit of claim 2, wherein the first current mirror comprises:
   a second transistor having a source coupled to a higher voltage supply, a drain coupled to the drain of the first transistor, and a gate coupled to its drain; and
   a third transistor having a source coupled to the higher voltage supply, a drain coupled to the gate of the power transistor, and a gate coupled to the gate of the second transistor.

4. The electronic circuit of claim 1, wherein the second current generation circuitry comprises:
   a fourth transistor having a drain coupled to a higher voltage supply, a source coupled to the gate of the power transistor, and a gate; and
   a fifth transistor having a drain coupled to the gate of the fourth transistor, a source coupled to the lower voltage supply, and a gate coupled to receive the OFF signal.

5. The electronic circuit of claim 4, wherein the fifth transistor is configured to turn off the third transistor in response to assertion of the OFF signal.

6. The electronic circuit of claim 1, wherein the first comparison circuitry comprises:
   a comparator having inputs coupled to the drain node and the reference voltage, and an output;
   a first NAND gate having a first input coupled to the output of the comparator and a second input coupled to receive the ON signal, and an output; and
   a first NOR gate having a first input coupled to the output of the first NAND gate, a second input coupled to receive a delayed version of the ON signal, and an output.

7. The electronic circuit of claim 6, wherein the third current generation circuitry comprises:
   a fifth transistor having a source coupled to a higher voltage supply, a drain coupled to the gate node, and a gate coupled to the output of the first NOR gate.

8. An electronic device for switching a power transistor having a drain coupled to a drain node, a source coupled to a lower voltage supply, and a gate coupled to a gate node, the electronic device comprising:
   first turn off circuitry coupled to the gate node and configured to draw a first current from the gate node in response to assertion of an OFF signal, the first current being proportional to a gate to source voltage of the power transistor;
   second turn off circuitry coupled to the gate node and configured to draw a second current from the gate node in response to assertion of the OFF signal, the second current being substantially constant; and
   second comparison circuitry configured to compare a gate voltage at the gate node to a reference voltage, and to draw a third current from the gate node when the gate voltage is less than the reference voltage.

9. The electronic device of claim 8, wherein the first turn off circuitry comprises:
   a first transistor having a drain coupled to the gate node, a source coupled to the lower voltage supply, and a gate; and
   a shorting circuit configured to short the drain and gate of the first transistor in response to assertion of the OFF signal, thereby causing the first transistor to draw the first current from the gate node.

10. The electronic device of claim 9, wherein the shorting circuit comprises:
    a second transistor having a source coupled to the gate node, a drain, and a gate;
    a third transistor having a drain coupled to the gate node, a source coupled to the drain of the second transistor, and a gate coupled to receive the OFF signal;
    an inverter having an input coupled to the gate of the third transistor and an output coupled to the gate of the second transistor; and
    a fourth transistor having a drain coupled to the drain of the second transistor and the source of the third transistor, a source coupled to the lower voltage supply, and a gate coupled to the gate of the second transistor and to the output of the inverter.

11. The electronic device of claim 8, wherein the second turn off circuitry comprises:
    a fifth transistor having a drain, a source, and a gate coupled to receive the OFF signal;
    a second current source CS2 coupled between the source of the fifth transistor and the lower voltage supply;
    a second current mirror having an input coupled to the drain of the fifth transistor, and an output coupled to a first node; and a third current mirror having an input coupled to the first node and an output coupled to the gate node, the output drawing the second current from the gate node.

12. The electronic device of claim 11, wherein the second current mirror comprises:
   a sixth transistor having a drain coupled to the drain of the fifth transistor, a source coupled to the higher voltage supply, and a gate coupled to its drain; and
   a seventh transistor having a drain coupled to the first node, a source coupled to the higher voltage supply, and a gate coupled to the gate of the sixth transistor.

13. The electronic device of claim 12, wherein the second comparison circuitry comprises:
   an eighth transistor having a source coupled to the higher voltage supply, a drain coupled to a second node, and a gate coupled to the gates of the sixth and seventh transistors;
   a ninth transistor having a drain coupled to the second node, a source coupled to the lower voltage supply, and a gate coupled to the gate node;
   a second NAND gate having a first input coupled to receive the OFF signal, a second input coupled to the second node, and an output;
   an OR gate having a first input coupled to the output of the second NAND gate, a second input coupled to receive a delayed version of the OFF signal, and an output; and
   a tenth transistor having a drain coupled to the gate node, a source coupled to the lower voltage supply, and a drain coupled to the output of the OR gate.

14. The electronic device of claim 11, wherein the third current mirror comprises:
   an eleventh transistor having a drain coupled to the first node, a source coupled to the lower voltage supply, and a gate coupled to its drain; and
   a twelfth transistor having a drain coupled to the gate node, a source coupled to the lower voltage supply, and a gate coupled to the gate of the eleventh transistor.

15. An electronic device for switching a power transistor having a drain coupled to a drain node, a source coupled to a lower voltage supply, and a gate coupled to a gate node, the electronic device comprising:
   first current sourcing circuitry configured to generate a first current to flow into the gate node in response to assertion of an ON signal, the first current being substantially constant;
   second current sourcing circuitry configured to generate a second current to flow into the gate node in response to deassertion of an OFF signal, the second current being inversely proportional to a gate to source voltage of the power transistor;
   first comparison circuitry configured to compare a drain voltage at the drain node to a reference voltage, and to activate third current generation circuitry to generate a third current to flow into the gate node when the drain voltage is less than the reference voltage;
   first current sinking circuitry coupled to the gate node and configured to draw a fourth current from the gate node in response to assertion of the OFF signal, the fourth current being proportional to a gate to source voltage of the power transistor;
   second current sinking circuitry coupled to the gate node and configured to draw a fifth current from the gate node in response to assertion of the OFF signal, the fifth current being substantially constant; and second comparison circuitry configured to compare a gate voltage at the gate node to a reference voltage, and to draw a sixth current from the gate node when the gate voltage is less than the reference voltage.

16. The electronic device of claim 15,
   wherein the first current sourcing circuitry comprises:
      a first transistor having a gate coupled to receive the ON signal, a drain, and a source,
      a first current source coupled between the source of the first transistor and the lower voltage supply, and
      a first current mirror having an input coupled to the drain of the first transistor and a first output coupled to the gate of the power transistor to output the first current thereto; and
   wherein the first current sinking circuitry comprises:
      a second transistor having a drain coupled to the gate node, a source coupled to the lower voltage supply, and a gate;
      a shorting circuit configured to short the drain and gate of the second transistor in response to assertion of the OFF signal, thereby causing the second transistor to draw current from the gate node.

17. The electronic device of claim 15,
   wherein the second current sinking circuitry comprises:
      a third transistor having a drain, a source, and a gate coupled to receive the OFF signal,
      a second current source CS2 coupled between the source of the third transistor and the lower voltage supply,
      a second current mirror having an input coupled to the drain of the third transistor, and an output coupled to a first node, and
      a third current mirror having an input coupled to the first node and an output coupled to the gate node, the output drawing the fifth current from the gate node; and
   wherein the second current sourcing circuitry comprises:
      a fourth transistor having a drain coupled to a higher voltage supply, a source coupled to the gate of the power transistor, and a gate, and
      a fifth transistor having a drain coupled to the gate of the fourth transistor, a source coupled to the lower voltage supply, and a gate coupled to receive the OFF signal.

18. A method of switching a power transistor, comprising:
   turning on the power transistor by:
      where a gate to source voltage of the power transistor is less than a miller plateau voltage of the power transistor, generating a first current to flow into a gate of the power transistor in response to assertion of an ON signal, the first current being substantially constant,
      where the gate to source voltage is within a threshold of the miller plateau voltage, generating a second current to flow into the gate in response to deassertion of an OFF signal, the second current being inversely proportional to the gate to source voltage, and
      where the gate to source voltage is higher than the miller plateau voltage, generating a third current to flow into the gate of the power transistor, the third current being substantially constant.

19. The method of claim 18, further comprising determining whether the gate to source voltage is higher than the miller plateau voltage as a function of a comparison between a drain voltage of the power transistor is and a reference voltage.

20. The method of claim 18, further comprising:
turning off the power transistor by:
- where the gate to source voltage is greater than the miller plateau voltage, drawing a fourth current from the gate of the power transistor in response to assertion of the OFF signal, the fourth current being proportional to the gate to source voltage;
- where the gate to source voltage is within a threshold of the miller plateau voltage, drawing a fifth current from the gate of the power transistor in response to assertion of the OFF signal, the fifth current being substantially constant; and
- where the gate to source voltage is less than the miller plateau voltage, drawing a sixth current from the gate of the power transistor, the sixth current being substantially constant.

21. A method of switching a power transistor, comprising:
turning off the power transistor by:
- where a gate to source voltage of the power transistor is greater than a miller plateau voltage of the power transistor, drawing a first current from a gate of the power transistor in response to assertion of an OFF signal, the first current being proportional to the gate to source voltage;
- where the gate to source voltage is within a threshold of the miller plateau voltage, drawing a second current from the gate of the power transistor in response to assertion of the OFF signal, the second current being substantially constant; and
- where the gate to source voltage is less than the miller plateau voltage, drawing a third current from the gate of the power transistor, the third current being substantially constant.

22. The method of claim 21, further comprising determining whether the gate to source voltage is higher than the miller plateau voltage as a function of a comparison between a drain voltage of the power transistor is and a reference voltage.

* * * * *

UNITED STATES PATENT AND TRADEMARK OFFICE
CERTIFICATE OF CORRECTION

PATENT NO. : 9,813,051 B2  
APPLICATION NO. : 15/052170  
DATED : November 7, 2017  
INVENTOR(S) : Zhenghao Cui Page 1 of 1

It is certified that error appears in the above-identified patent and that said Letters Patent is hereby corrected as shown below:

In the Specification

At Column 5, Line number 43, please replace [[currents 13 and 14.]] with -- currents I3 and I4. --

Signed and Sealed this  
Nineteenth Day of December, 2017

Joseph Matal  
*Performing the Functions and Duties of the*  
*Under Secretary of Commerce for Intellectual Property and*  
*Director of the United States Patent and Trademark Office*